United States Patent [19]
Williams et al.

[11] 4,348,667
[45] Sep. 7, 1982

[54] AUTOMATIC LINE SEGMENT GENERATOR FOR USE WITH LINEAR ARRAY DISPLAY DEVICES

[75] Inventors: Glenn L. Williams, Bay Village; A. Dix Brown, Cleveland Heights; Edward J. Reilly, Mayfield Heights, all of Ohio

[73] Assignee: Gould Inc., Rolling Meadows, Ill.

[21] Appl. No.: 183,841

[22] Filed: Sep. 3, 1980

[51] Int. Cl.³ .............................................. G09G 3/20
[52] U.S. Cl. .................................. 340/753; 340/706; 346/76 PH
[58] Field of Search ............... 340/706, 722, 754, 753; 346/76 PH

[56] References Cited

U.S. PATENT DOCUMENTS

| | | |
|---|---|---|
| 3,605,109 | 9/1971 | Tyler et al. |
| 3,893,075 | 7/1975 | Orban et al. |
| 3,902,476 | 9/1975 | Hileman |
| 3,968,499 | 7/1976 | Lowe et al. |
| 4,038,668 | 7/1977 | Quarton |
| 4,068,310 | 1/1978 | Friauf |
| 4,145,754 | 3/1979 | Utzerath ........................ 340/706 X |
| 4,193,122 | 3/1980 | Bowers |
| 4,271,414 | 6/1981 | Williams et al. ............... 346/76 PH |
| 4,311,997 | 1/1982 | Madni ................................. 340/722 |

*Primary Examiner*—David L. Trafton
*Attorney, Agent, or Firm*—E. E. Sachs; John R. Garrett

[57] ABSTRACT

An automatic line segment generator is disclosed primarily for use with linear array display devices. Converted analog data is received from a single slope analog to digital converter. This received digital data is synchronized with a system clock and is positioned and stored as line segment data during one measurement period of the analog to digital converter. New data is received during the next measurement period and is then synchronized, positioned and compared against the previously stored line segment data. The length of the line segment in storage will remain the same or increase based on the position and length of the newly received data, i.e. if the new data position is within the stored data position, the stored data remains the same and if the new data position is outside of the stored data position, the stored data length will increase to the new data position.

9 Claims, 17 Drawing Figures

TRUTH TABLE FOR COMPARING MEANS 18

| 32 | 34 | 36 | 38 | 40 |
|----|----|----|----|----|
| 0  | 0  | 0  | 0  | 0  |
| 0  | 0  | 0  | 1  | 0  |
| 0  | 0  | 1  | 0  | 0  |
| 0  | 0  | 1  | 1  | 1  |
| 0  | 1  | 0  | 0  | 0  |
| 0  | 1  | 0  | 1  | 0  |
| 0  | 1  | 1  | 0  | 1  |
| 0  | 1  | 1  | 1  | 1  |
| 1  | 0  | 0  | 0  | 0  |
| 1  | 0  | 0  | 1  | 1  |
| 1  | 0  | 1  | 0  | 0  |
| 1  | 0  | 1  | 1  | 1  |
| 1  | 1  | 0  | 0  | 1  |
| 1  | 1  | 0  | 1  | 1  |
| 1  | 1  | 1  | 0  | 1  |
| 1  | 1  | 1  | 1  | 1  |

FIG.2

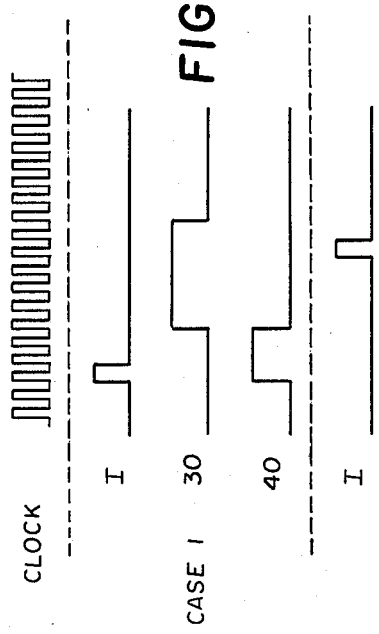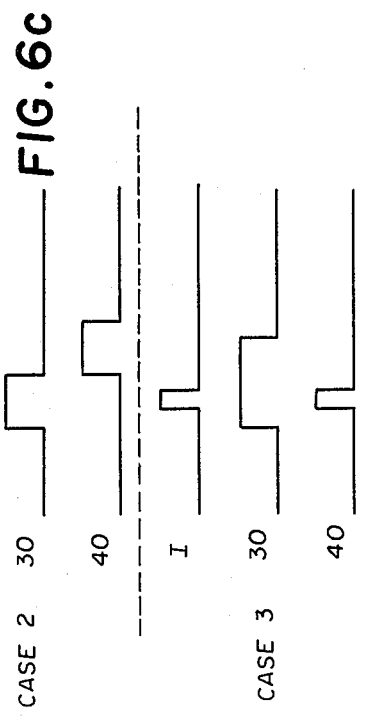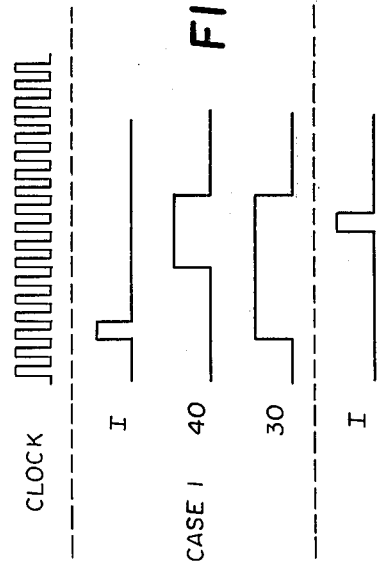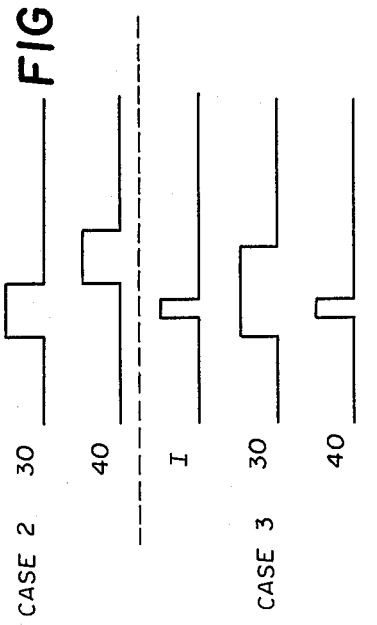

AUTOMATIC LINE SEGMENT GENERATOR FOR USE WITH LINEAR ARRAY DISPLAY DEVICES

BACKGROUND OF THE INVENTION

The present invention relates to linear array display devices and is more particularly directed to a signal processing circuit for use therewith, i.e., a device to generate line segments from digital input data. One such type of linear array display device is a linear thermal array.

It is known in the art to fabricate thermal recording devices having imaging stylii arranged in a linear array. Such devices typically are comprised of a plurality of stylii which are formed by disposing electrically resistive material on an insulating substrate to form a plurality of individual stylus in a single row. These stylii are electrically connected to drive circuits of the type disclosed in co-pending U.S. Patent Application Ser. No. 79,760, filed Sept. 28, 1979, now abandoned, and assigned to the assignee of the present application. Each stylus is selectively energized by the drive circuits to produce Joule heat. When the stylii are brought into contact with or in suitable proximity with a thermal sensitive imaging medium, each energized stylus makes a mark on the medium. Specialized protection circuits may be employed to control the drive circuits in order to prevent thermal overheating or even thermal burn-out. Such circuits are disclosed in co-pending U.S. Patent Application Ser. No. 72,542, now U.S. Pat. No. 4,246,587, and Ser. No. 72,544, now U.S. Pat. No. 4,271,414, both filed on Sept. 4, 1979, and assigned to the same assignee as the present invention.

The input data that is either directly printed through the drive circuits or processed through the above-mentioned specialized protection circuits prior to being printed must typically be in the form of digital input data. If the monitored input data to be printed is an analog signal, other processing circuitry is required to convert the analog signal into an appropriate digital signal, i.e., by use of an analog to digital (hereinafter A to D) converter. One such type of A to D converter that employs the single slope method of conversion is disclosed in co-pending U.S. Patent Application Ser. No. 146,696, filed May 5, 1980, now abandoned, and assigned to the same assignee as the present invention.

Since a linear array display device can print only dots or line segments, a need was recognized to have a circuit that would process the data converted by an A to D converter into dots and line segments that would be commensurate with the monitored analog input signal. One contemplated method of accomplishing this would be to use a micro-processor to generate a line segment based on the converted data from the A to D converter. However, micro-processor based circuits typically require peripheral circuitry which would be a more costly approach than if the same function could be accomplished by discrete circuitry. The prior art teaches line segment makers for use with CRT display devices that convert measured values into discrete values which are in turn displayed as single dots. Prior art devices that display dots present problems when the analog input signal is at high frequency or when there are several overlapping waveforms in that it would be obviously difficult to distinguish what one was looking at.

OBJECTS OF THE INVENTION

An object of the present invention is to provide a circuit that can process data from an analog to digital converter and generate a line segment therefrom for use with linear array display devices.

Another object of the invention is to provide a line segment generator circuit that does not require initial conversion of an analog input signal into digital values.

Still another object of the present invention is to provide a more simplified circuit than has heretofore been possible that connects elements in two or more successive sampling periods.

The above objects are given by way of example. Thus other desirable objectives and advantages achieved by the invention may occur to those skilled in the art. The scope of the invention is to be limited only by the appended claims.

BRIEF SUMMARY OF THE INVENTION

The above objects and other advantages are achieved by the present invention. A circuit is provided for processing data to use with linear array display devices. An incoming digital data pulse is received, preferably from a single slope, A to D converter which represents the digital conversion of a monitored analog signal during one measurement period. The incoming data pulse is then stored as a part of a line segment. The next digital data pulse is received and is compared to previously stored data to determine whether the line segment shiould be increased or remain the same. If the line segment is to be increased, the stored data is updated to reflect the increase. When the stored data is to be printed or passsed to the linear array display device, data is stored in a position such that the new digital data which represents a new line segment will be connected to the end of the previously printed line segment. The line segment generation is continued as long as the analog signal is monitored.

BRIEF DESCRIPTION OF THE DRAWINGS

FIG. 2 is a truth table for a portion of the embodiment shown in FIG. 1;

FIGS. 5a–5d are signal waveform representations for illustrating the operation of the embodiment shown in FIG. 1;

FIG. 6a–6d are signal waveform representations for illustrating the operation of the embodiment shown in FIG. 1;

FIG. 7 is a break out enlargement of a portion of the generated line segments shown in FIG. 3.

DESCRIPTION OF THE PREFERRED EMBODIMENTS

Figure 1:
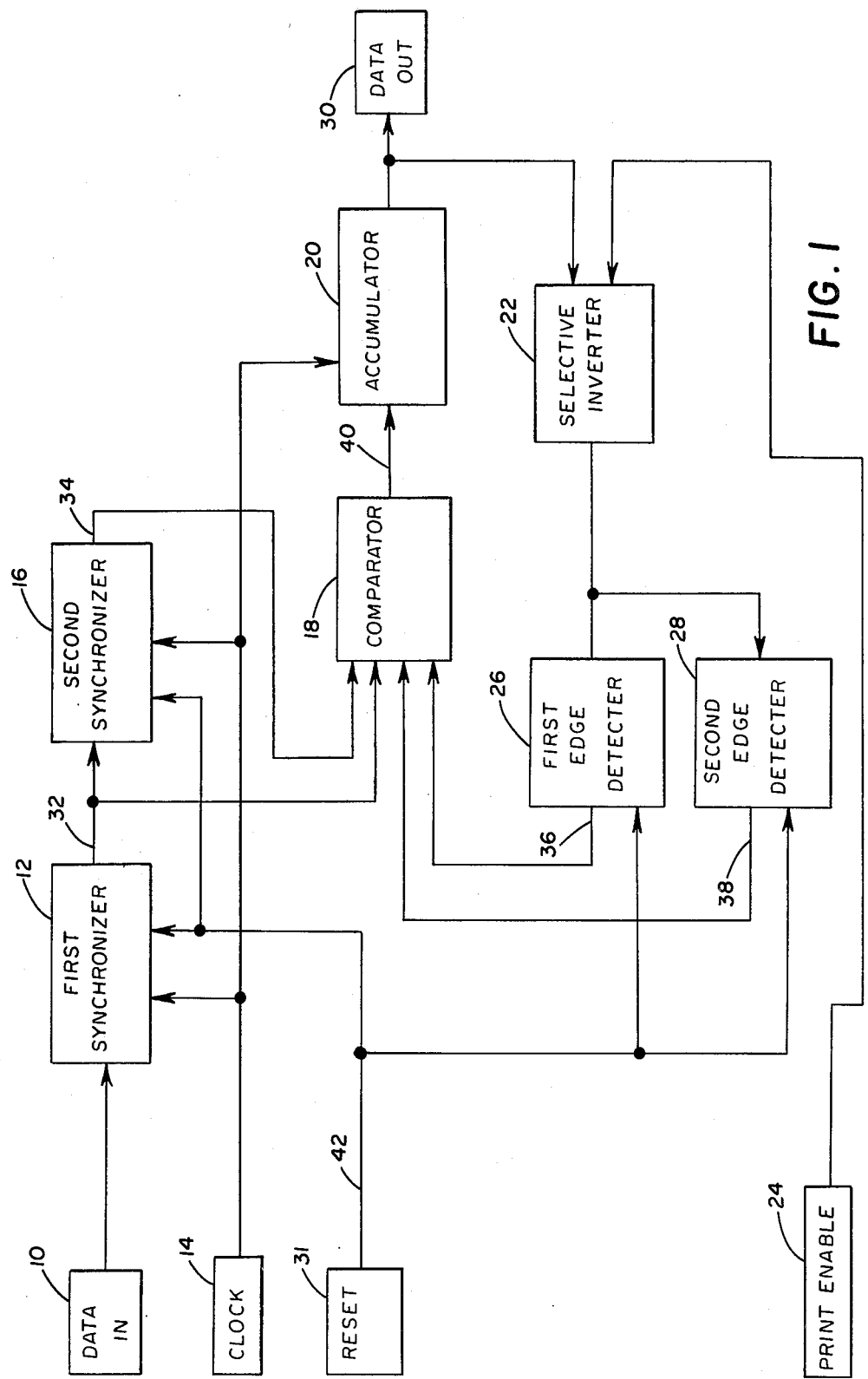
FIG. 1 is a block diagram showing a generalized embodiment of the present invention.

A description of the invention follows, referring to the drawings in which like reference numerals denote like elements of structure in each of the several Figures.

In this application, the word "HIGH" is used, as is known in the art, to represent a digital voltage level. A digital HIGH in this application will also be designated by the numeral "1" and will be referred to as a "logic state 1". The word "LOW" is used, as is known in the art, to represent a different, lower digital voltage level. A digital LOW in this application will also be designated by the numeral "0" and will be referred to as a "logic state 0". The voltage levels that define a digital HIGH or a digital LOW will depend on the type of digital devices used. For example, if Transistor-Transistor Logic (TTL) is used, a digital LOW will typically be from 0.0 to 0.8 volts d.c. and a digital HIGH will be from 2.0 to 5.0 volts d.c.

Figure 3:
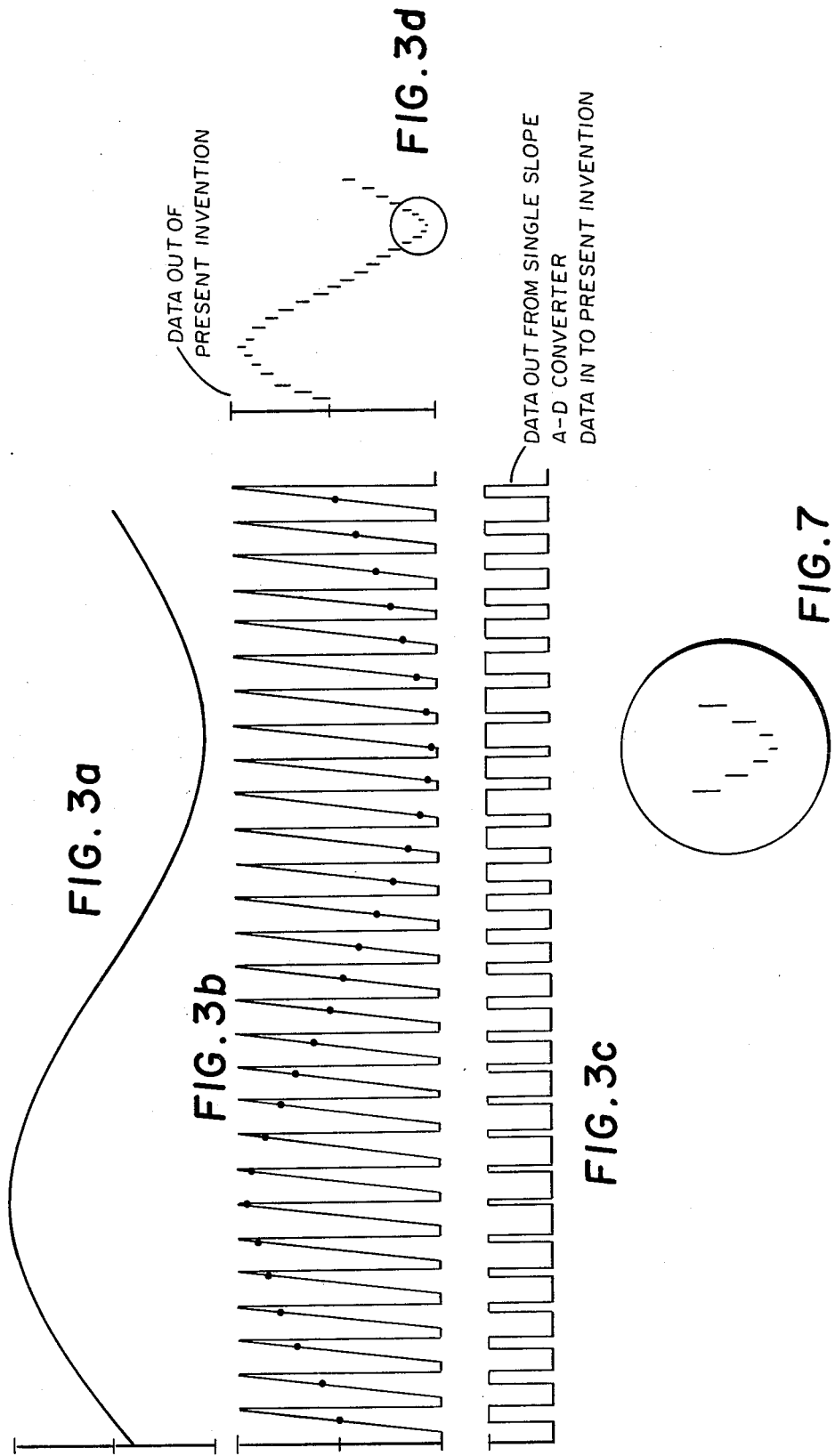
FIGS. 3a–3d are signal wave form representations for illustrating the analog to digital conversion from a single slope converter in combination with the operation of the embodiment shown in FIG. 1.

Referring now to FIG. 1, incoming data 10 is received by first synchronizer 12. Incoming data 10 is digital data of the type generated by a single slope A to D converter such as that described in co-pending U.S. Patent Application Ser. No. 146,969, filed May 5, 1980 and assigned to the assignee of the present application and is hereby incorporated herein. FIGS. 3a–3d show the output response for a typical single slope A to D converter. FIG. 3a is a typical analog signal that is monitored for eventual printing in a linear array recorder. FIG. 3b represents the ramp of the A to D converter with the dots representing the cross-over points in which the ramp voltage equals the analog voltage. FIG. 3c represents the resultant digital output signal from the A to D converter that is the data in 10 of the present invention. The present invention contemplates that the output of the A to D converter will comprise a FLIP-FLOP as shown in the above-incorporated reference in order to prevent a double sample during a single ramp.

In FIG. 1, clock 14 is operatively connected to first synchronizer 12 in order to establish a timing sequence. A second synchronizer 16 is provided that is operatively connected to both the output of first synchronizer 12 and to clock 14. It is preferable that first synchronizer 12 delay the incoming data 10 by not more than one clock pulse and that second synchronizer 16 preferably delay the output data from first synchronizer 12 by not more than one additional clock pulse; the effect of second synchronizer is preferably to delay incoming data 10 by not more than two clock pulses. The output of first synchronizer 12 and second synchronizer 16 are operatively connected to comparator 18. Comparator 18 has four inputs, the two of which not heretofore mentioned will be discussed infra. The output of comparator 18, functionally to be discussed infra, is operatively connected in accumulator 20. The accumulator 20 is operatively connected to clock 14 and accumulates and positions the output signal from comparator 18 such that the data in accumulator 20 will correspond to positions within the linear array display device. The output of accumulator 20 is operatively connected to selective inverter 22. Print enable circuit 24 is also operatively connected to selective inverter 22 for controlling when inversion of incoming digital signal to selective inverter 22 occurs. For example, assume print enable circuit 24 is normally a digital LOW when printing is not to occur. When the output of accumulator 20 is HIGH, a HIGH will be passed by selective inverter 22, or when a LOW output occurs from accumulator 20, a LOW will be passed by selective inverter 22, i.e. no inverting occurs. When print enable circuit 24 is HIGH, the output signal from accumulator 20 will be digitally inverted and passed by selective inverter 22. As will be appreciated by those skilled in the art, the operational function of print enable circuit 24 can be reversed, i.e. inversion can occur with a LOW and no inversion with a HIGH. The output of selective inverter 22 is operatively connected to first edge detector 26 and to second edge detector 28. First edge detector 26 detects when the digital output state of selective inverter 22 changes from a LOW to a HIGH. Second edge detector 28 detects when the digital output state of selective inverter 22 changes from a HIGH to a LOW. First edge detector 26 is known in the art as a rising edge detector and second edge detector 28 is known in the art as a falling edge detector. The output of first edge detector 26 and the output of second edge detector 28 are the other two inputs discussed supra of comparator 18. Data out 30 is the output of accumulator 20. The data out 30 from accumulator 20 represents the accumulated line segment.

Reset 31 is operatively connected to first synchronizer 12, second synchronizer 16, first edge detector 26 and second edge detector 28. An initialization of these four functional means will occur each time the ramp resets in the A to D converter.

The function of comparator 18 is exemplified by the truth table depicted in FIG. 2. Output 32 of first synchronizer 12, output 34 of second synchronizer 16, output 36 of first edge detector 26 and output 38 of second edge detector 28 are the inputs of comparator 18. The output 40 of comparator 18 can be accomplished by several different logic combinations, as will be apparent to those skilled in the art, but the resultant output must conform with the truth table.

Figure 4:
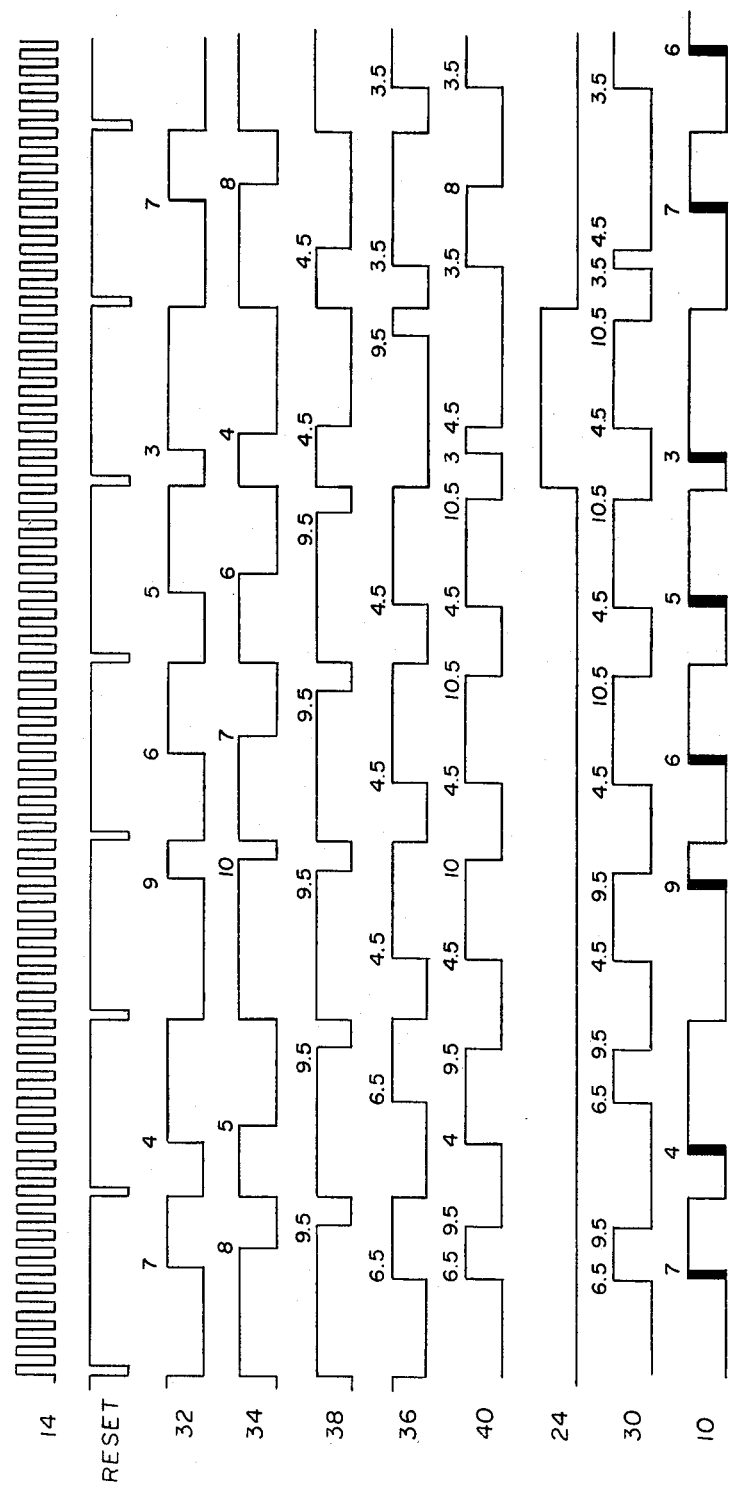
FIG. 4 is a signal waveform representation for illustrating the operation of the embodiment shown in FIG. 1.

Referring now to FIGS. 3a–3d and 4, the operation of the present invention can be appreciated. Digital data such as that shown on FIG. 3c is received from a single slope A to D converter. This received incoming digital data is synchronized with the system clock 14 by first synchronizer 12 to delay the incoming data by not more than one clock pulse and is also synchronized by second synchronizer 16 to delay the incoming digital data by two or more clock pulses. The digital output state of second synchronizer 16 is preferably opposite that of first synchronizer 12, and the digital output state of second edge detector 28 is preferably opposite that of first edge detector 26. For the purpose of clarity, only 10 clock pulses are shown per measurement period. It will be obvious to those skilled in the art that the waveforms can be operative for any number of clock pulses. It is preferable that the number of clock pulses and the number of positions in the accumulator is equal to the number of imaging positions in the linear array display. For the purpose of illustration, it is assumed that prior line segment data is in accumulator 20 beginning at clock pulse 6 and ending at clock pulse 9. The existence of line segment data in accumulator 20 is indicated by HIGH true signals at 30. It is further assumed that print enable circuit 24 is a HIGH true function, i.e. LOW means the system will not print or output its data and HIGH means the system will print or output its data. This is referred to in the art as the "dump" mode, i.e. the data in accumulator 20 is dumped out on the print enable command. The bottom line of data 10 in FIG. 4 is the assumed incoming data. The integer number above the pulse represents the rising edge of the corresponding clock pulse with the 0.5 representing the falling edge of the corresponding clock pulse. When the incoming data goes HIGH, output 32 goes HIGH on the next clock pulse and 34 goes LOW on the following clock pulse. Since it was assumed that a line segment was initially in accumulator 20, output 36 went HIGH on clock pulse 6 and output 38 went LOW on clock pulse 9. It will be apparent to those skilled in the art that in this illustration, first edge detector 26 is a rising edge detector and second edge detector 28 is a falling edge detector. A line segment is generated by this invention following this rule: the first output to go HIGH between outputs 32 and 36 begins the line segment going into accumulator 20 and the last to go LOW between outputs 34 and 38 ends the line segment. It will be apparent to those skilled in the art that the line segment length is a function of the present incoming data and the past incoming data.

There are three possible conditions that may occur with regard to the timing between the incoming data and the accumulated line segment when the system is not in the print mode. FIGS. 5a–5d show these three conditions. The present invention can be thought of as generating an imaginary digital pulse I. This imaginary pulse begins when output 32 goes HIGH and ends when output 34 goes low. Case 1, FIG. 5b, shows when pulse I occurs in position prior to the presently existing line segment data. The resultant line segment will increase in the forward direction to fill the position such that the new resultant line segment begins in the position of the pulse I and ends where the prior existing line segment ended. Case 2, FIG. 5c, shows when the pulse I occurs in a position after the presently existing line segment data. The line segment will increase in that direction such that the new resultant line segment will begin where the old segment began and end where the pulse I ended. Case 3, FIG. 5d, shows when the pulse I occurs completely within the presently existing line segment position. The result is no effect on the accumulated segment. When the data or line segment in accumulator 20 is to be printed or dumped, print enable circuit 24 goes HIGH. Selective inverter 22 inverts the data from accumulator 20 prior to its being passed to first edge detector 26 and second edge detector 28. As can be seen in FIG. 4, a data pulse will remain in accumulator 20 at the point where the last line segment ended. This ensures continuity from line segment to line segment.

FIG. 3d shows what the output of the present invention would look like if printed by a linear thermal array. It should be noted that the line segment length is generated by the present invention and that the next succeeding line segment begins where the last one left off. In a printout of a linear display array, print enable can occur at such frequency as to leave little or no horizontal spacing between successive line segments. A portion of the output data from the present invention is shown as an enlargement in FIG. 7. It can be seen from this Figure that the line segment length varies as a function of the crossover occurrences from the single slope converter. The larger the vertical distance between crossovers, the longer the line segment will be.

There are three possible conditions that may occur with regard to the timing between the incoming data and the accumulated line segment when the system is in print mode. FIGS. 6a–6d show these three conditions. The three cases will again be described in terms of the imaginary pulse I as was described supra. Case 1, FIG. 6b, shows when pulse I occurs in a position prior to the presently existing line segment. The resultant line segment occurs when the imaginary pulse goes HIGH and ends when the prior line segment goes HIGH, thus assuring continuity between successively printed line segments. Case 2, FIG. 6c, shows when pulse I occurs in a position after the presently existing line segment. The resultant line segment occurs when the present line segment data goes LOW and ends when the imaginary pulse I goes LOW. Case 3, FIG. 6d, shows when the imaginary pulse I occurs in a position completely within the presently existing line segment data. The resultant line segment will be a pulse equal to the imaginary pulse I.

Figure 8:
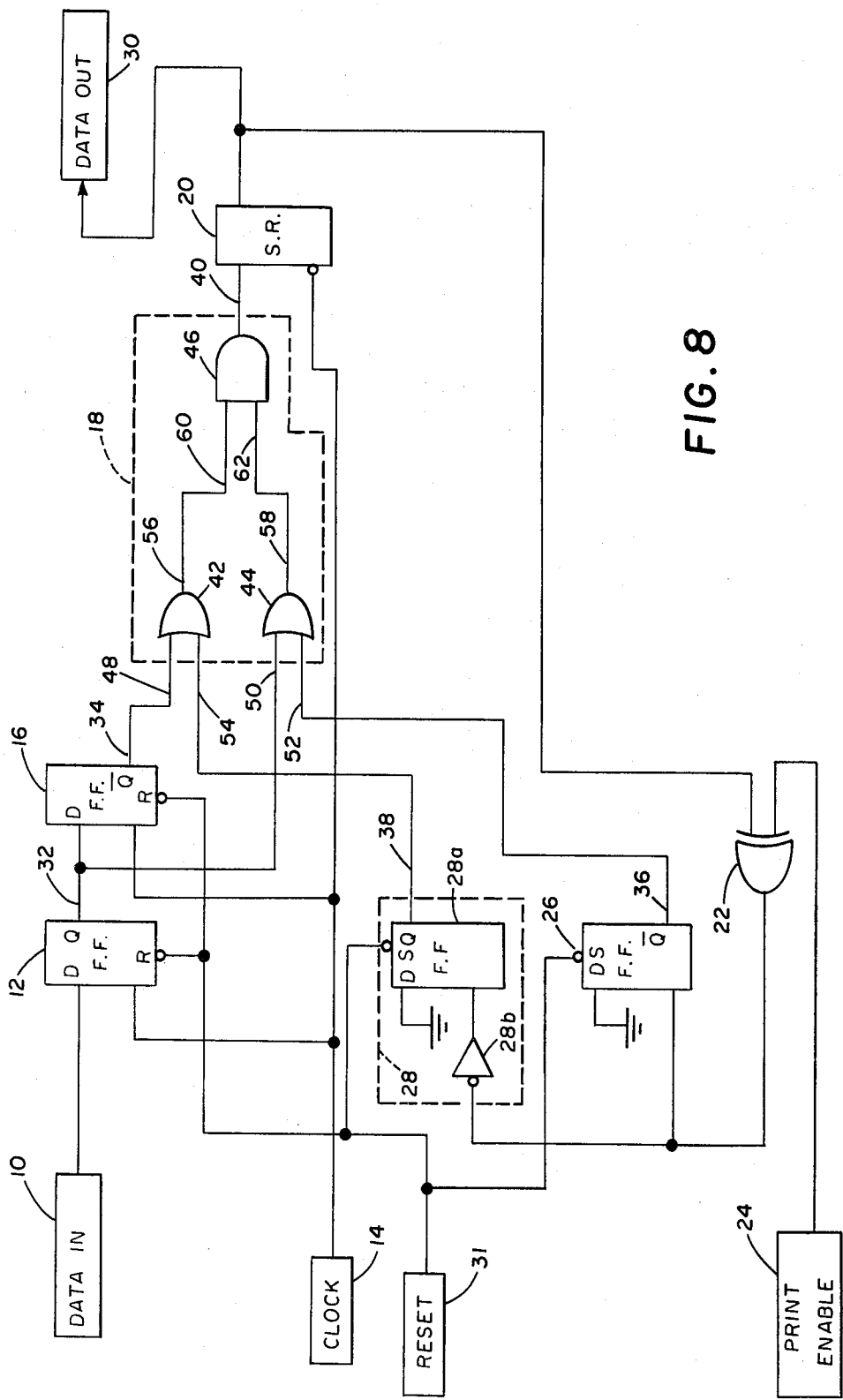
FIG. 8 is a circuit diagram showing an embodiment of the present invention according to the generalized embodiment shown in FIG. 1.

FIG. 8 shows a circuit schematic using discrete digital devices that functionally accomplishes the invention shown in FIG. 1. The function of first synchronizer 12 and second synchronizer 16 is accomplished by use of FLIP-FLOPs. The function of comparator 18 is accomplished by use of two OR gates 42 and 44 and an AND gate 46. Output 34 of FLIP-FLOP 16 is connected to input 48 of OR gate 42. Output 32 of FLIP-FLOP 12 is connected to input 50 of OR gate 44. The function of first edge detector 26 is accomplished by use of a FLIP-FLOP. The function of second edge detector 28 is accomplished by use of a FLIP-FLOP 28a in combination with an INVERTER 28b. The output 36 of first edge detector 26 is connected to input 52 of OR gate 44. Output 38 of second edge detector 28 is connected to input 54 of OR gate 42. Output 56 of OR gate 42 and output 58 of OR gate 44 are the inputs 60 and 62, respectively, of AND gate 46. The output 40 of AND gate 46 will be that as shown in FIG. 2. The function of accumulator 20 is accomplished by use of a shift register whose number of bits is preferably equal to or greater than the number of print positions in the linear display array. For example, if a linear thermal array has 512 stylii, the shift register 20 will have 512 bits. The function of selective inverter 22 is accomplished by use of an EXCLUSIVE-OR gate.

By use of a limited number of inexpensive, discrete, digital devices, the present invention generates line segments for linear array display devices from converted analog data.

This invention has been described with reference to preferred embodiments. Obvious modifications and alterations will occur to others upon reading and understanding of this specification. The intention is to include all such modifications and alterations insofar as they come within the scope of the appended claims or the equivalent thereof.

We claim:
1. An apparatus for automatically generating line segments for use with linear array display devices, said apparatus comprising:
clock means;
synchronizing means operatively connected to said clock means for receiving and synchronizing incoming digital data to said clock means;
comparing means operatively connected to said synchronizing means to compare the output of said synchronizing means to another signal and produce line segment data;
accumulator means operatively connected to said comparing means to accumulate said line segment data; and
edge detecting means to detect changes in digital states of said accumulator means, the output of said edge detecting means being said another signal to said comparing means, said comparing means automatically generating line segment data beginning when data is first synchronized or first detected and ending when data is last synchronized or detected.

2. An apparatus for automatically generating line segments for use with linear array display devices, said apparatus comprising:

clock means for establishing a time sequence, said line segment corresponding to a finite number of clock pulses wherein each clock pulse corresponds to a different array position;

first synchronizing means operatively connected to said clock means for receiving and synchronizing incoming digital data to said clock means, said incoming digital data representing a converted analog signal;

second synchronizing means operatively connected to said clock means and said first synchronizing means to delay the output of said first synchronizing means by at least one clock pulse of said clock means;

comparing means with inputs operatively connected to said first synchronizing means, said second synchronizing means and to two other means, said comparing means producing line segment data from the four input means;

accumulator means operatively connected to said comparing means and to said clock means, said accumulator means positioning and storing said line segment data for future output to said linear array display devices;

selective inverting means operatively connected to said accumulator means and the print command for said linear array display devices, to invert said line segment data from said accumulator means when there is a print command present and not to invert said line segment data when a print command is not present;

first edge detecting means operatively connected to said selective inverting means to detect a change in digital state from said selective inverting means wherein the output of said first detection means is the first other input of said comparing means; and second edge detecting means operatively connected to said selective inverting means to detect a different change in digital state from said selective inverting means wherein the output of said second edge detecting means is the second other input of said comparing means, said comparing means automatically generating line segment data for the clock position beginning when data first exists either in said first synchronizing means or first detected by said first edge detecting means and ending when data last exists in both said second synchronizing means and detected by said second detecting means.

3. The apparatus as defined by claim 2 further comprising a reset means operatively connected to said first synchronizing means, said second synchronizing means, said first edge detecting means and said second edge detecting means for initializing the four means to a known digital state each time the number of clock pulses equals the number of linear array positions.

4. The apparatus as defined in claim 2 wherein the first synchronizing means is a FLIP-FLOP.

5. The apparatus as defined in claim 2 wherein the second synchronizing means is a FLIP-FLOP.

6. The apparatus as defined in claim 2 wherein the accumulator means is a shift register, the number of bits in said shift register being equal to the number of linear array positions.

7. The apparatus as defined in claim 2 wherein the selective inverting means is an EXCLUSIVE—OR gate.

8. The apparatus as defined in claim 2 wherein the first edge detector is a FLIP-FLOP.

9. The apparatus as defined in claim 2 wherein the second edge detector is a FLIP-FLOP with an inverted input.

* * * * *

UNITED STATES PATENT AND TRADEMARK OFFICE
CERTIFICATE OF CORRECTION

PATENT NO. : 4,348,667
DATED : September 7, 1982
INVENTOR(S) : G.L.Williams, A.D.Brown, E.J.Reilly It is certified that error appears in the above-identified patent and that said Letters Patent are hereby corrected as shown below:

In column 1, line 47, please change "146,696" to --146,969--; and
In column 2, line 10, please change "digital" to --discrete--; and
In column 2, line 32, please change "shi-" to --sh- --;
In column 2, line 36, please change "passsed" to --passed--.

IN THE CLAIMS:

In Claim 2, column 7, line 10, please change "time" to --timing--.

Signed and Sealed this

Eighth Day of February 1983

[SEAL]

Attest:

GERALD J. MOSSINGHOFF

Attesting Officer

Commissioner of Patents and Trademarks